(12) United States Patent
Aisaka

(10) Patent No.: US 6,823,179 B2
(45) Date of Patent: Nov. 23, 2004

(54) TRANSMISSION POWER DETECTING APPARATUS AND TRANSMISSION APPARATUS

(75) Inventor: Hideki Aisaka, Hino (JP)

(73) Assignee: Kabushiki Kaisha Toshiba, Tokyo (JP)

(*) Notice: Subject to any disclaimer, the term of this patent is extended or adjusted under 35 U.S.C. 154(b) by 447 days.

(21) Appl. No.: 10/092,485

(22) Filed: Mar. 8, 2002

(65) Prior Publication Data

US 2002/0127981 A1 Sep. 12, 2002

(30) Foreign Application Priority Data

Mar. 8, 2001 (JP) ........................................ 2001-065255

(51) Int. Cl.[7] .............................................. H04B 1/04
(52) U.S. Cl. ............................... 455/127.1; 455/127.5; 455/209
(58) Field of Search ............................ 455/127, 127.2, 455/127.3, 127.4, 127.5, 130, 136, 143, 150.1, 154.1, 168.1, 209, 232.1; 330/144, 284, 85, 129, 279; 315/307, 151, 158; 378/110, 105, 106, 109

(56) References Cited

U.S. PATENT DOCUMENTS 4,573,184 A * 2/1986 Tanaka et al. ............... 378/110
5,051,666 A * 9/1991 Jensen ......................... 315/307
5,585,762 A * 12/1996 Dekker ........................ 330/144

* cited by examiner

Primary Examiner—Tony T. Nguyen
(74) Attorney, Agent, or Firm—Finnegan, Henderson, Farabow, Garrett & Dunner, L.L.P.

(57) ABSTRACT

A plurality of detectors each output a detection signal corresponding to an output power of a corresponding one of a plurality of transmitting units. The detection signal passes through a corresponding one of a plurality of rectifiers each corresponding to the associated detector and is inputted to an input terminal of a smoothing device to allow the detection signal to be smoothed.

6 Claims, 3 Drawing Sheets

TRANSMISSION POWER DETECTING APPARATUS AND TRANSMISSION APPARATUS

CROSS-REFERENCE TO RELATED APPLICATIONS

This application is based upon and claims the benefit of priority from the prior Japanese Patent Application No. 2001-065255, filed Mar. 8, 2001, the entire contents of which are incorporated herein by reference.

BACKGROUND OF THE INVENTION

1. Field of the Invention

The present invention relates to a transmission apparatus, such as a radio telephone apparatus, and a transmission power detecting apparatus for detecting transmission power at such the transmission apparatus.

2. Description of the Related Art

FIG. 1 shows an arrangement of a radio transmitting section of a conventional radio telephone apparatus.

The radio telephone apparatus has a transmitting unit 1 and transmitting unit 2. The transmission frequency of the transmitting unit 1 is a predetermined frequency f1. The transmission frequency of the transmitting unit 2 is a predetermined frequency f2 higher than the frequency f1. The transmitting units 1 and 2 comprise modulators 1a and 2a, intermediate frequency band oscillators 1b and 2b, AGC amplifiers 1c and 2c, up-converters 1d and 2d, local oscillators 1e and 2e, bandpass filters 1f and 2f, and power amplifiers 1g and 2g, respectively.

The transmitting units 1 and 2 have their transmit operations controlled by a controller 3 to prevent both from simultaneously outputting their transmit signals. The transmit signals which are outputted from the transmitting units 1 and 2 are supplied, respectively through bandpass filters 4 and 5, to a diplexer 6 and then to an antenna 7 where each transmit signal is radiated.

In this type of radio telephone apparatus, it is necessary to monitor transmission power so as to, for example, control it. To this end, a transmission power detecting apparatus 8 is provided. The transmission power detecting apparatus 8 has power detectors (DET) 8a and 8b, a rectifying diode 8c and smoothing capacitor 8d.

The power detectors 8a and 8b detect the power levels of outputting signals from the transmitting units 1 and 2. The power detectors 8a and 8b output detection signals representing the detecting power levels. Thus, the detection signal becomes an AC signal having its level varied in accordance with a variation in power level of the outputting signals from the transmitting units 1 and 2.

The output terminals of the power detectors 8a and 8b are connected to the anode of the rectifying diode 8c. An output terminal T is connected to the cathode of the rectifying diode 8c, and the cathode of the rectifying diode 8c is grounded through the smoothing capacitor 8d. Thus, the detection signal outputted from either of the power detectors 8a and 8b is converted to a DC voltage by the rectifying diode 8c and smoothing capacitor 8d and outputted from the output terminal T.

In such transmission power detecting apparatus 8, the transmitting units 1 and 2 perform no simultaneous transmit operation and, by utilizing this, a DC voltage conversion circuit is shared, the DC voltage conversion circuit comprising the rectifying diode 8c and smoothing capacitor 8d. By doing so, the circuit size is made smaller.

Incidentally, if the transmission power detecting apparatus 8 is so configured as set out above, a portion of the output signal of one of the transmitting units flows into the other transmitting system, thus producing a waste loss. As a result, the transmission power becomes smaller.

Further, there is sometimes the case where, depending upon a relation between the frequencies f1 and f2, a high harmonic wave of one frequency occupies the same frequency band of the other frequency. In this case, there is a risk that the high harmonic wave flows into said other transmitting system will be supplied through the bandpass filter 4 or bandpass filter 5 to the antenna 7 and a high harmonic component will be radiated.

BRIEF SUMMARY OF THE INVENTION

The object of the present invention is to provide an apparatus which has a simple structure and can yet prevent transmitting systems from flowing unnecessary signals from one the other.

According to one aspect of the present invention, there is provided a transmission power detecting apparatus used for a transmission apparatus having a plurality of transmitting units with each transmission unit performing no simultaneous transmit operation relative to a remaining transmitting unit and adapted to detect a transmission power at the output of the transmission unit, comprising a plurality of detectors each configured to output a detection signal corresponding to an output power of a corresponding one of the transmitting units; a plurality of rectifiers each configured to receive an output of the corresponding detector at an input terminal and to allow a flow of only electric current from the input terminal toward an output terminal; and a smoothing device configured to smooth a signal supplied to one input terminal to which output terminals of the rectifiers are connected.

According to another aspect of the present invention, there is provided a transmission apparatus comprising a plurality of transmitting units each configured to perform no simultaneous transmit operation relative to a remaining transmitting unit; a plurality of detectors each configured to output a detection signal corresponding to an output power of the corresponding one of the transmitting units; a plurality of rectifiers each configured to receive an output of the corresponding detector at an input terminal and to allow only electric current from the input terminal toward an output terminal; a smoothing device configured to smooth a signal supplied one input terminal to which the output terminals of the rectifiers are connected; and a controller configured to control transmission power of the transmitting unit, which is performing the transmit operation, on the basis of a signal smoothed by the smoothing device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the present invention.

DETAILED DESCRIPTION OF THE INVENTION

One embodiment of the present invention will be described below by referring to the accompanying drawings.

Figure 1:
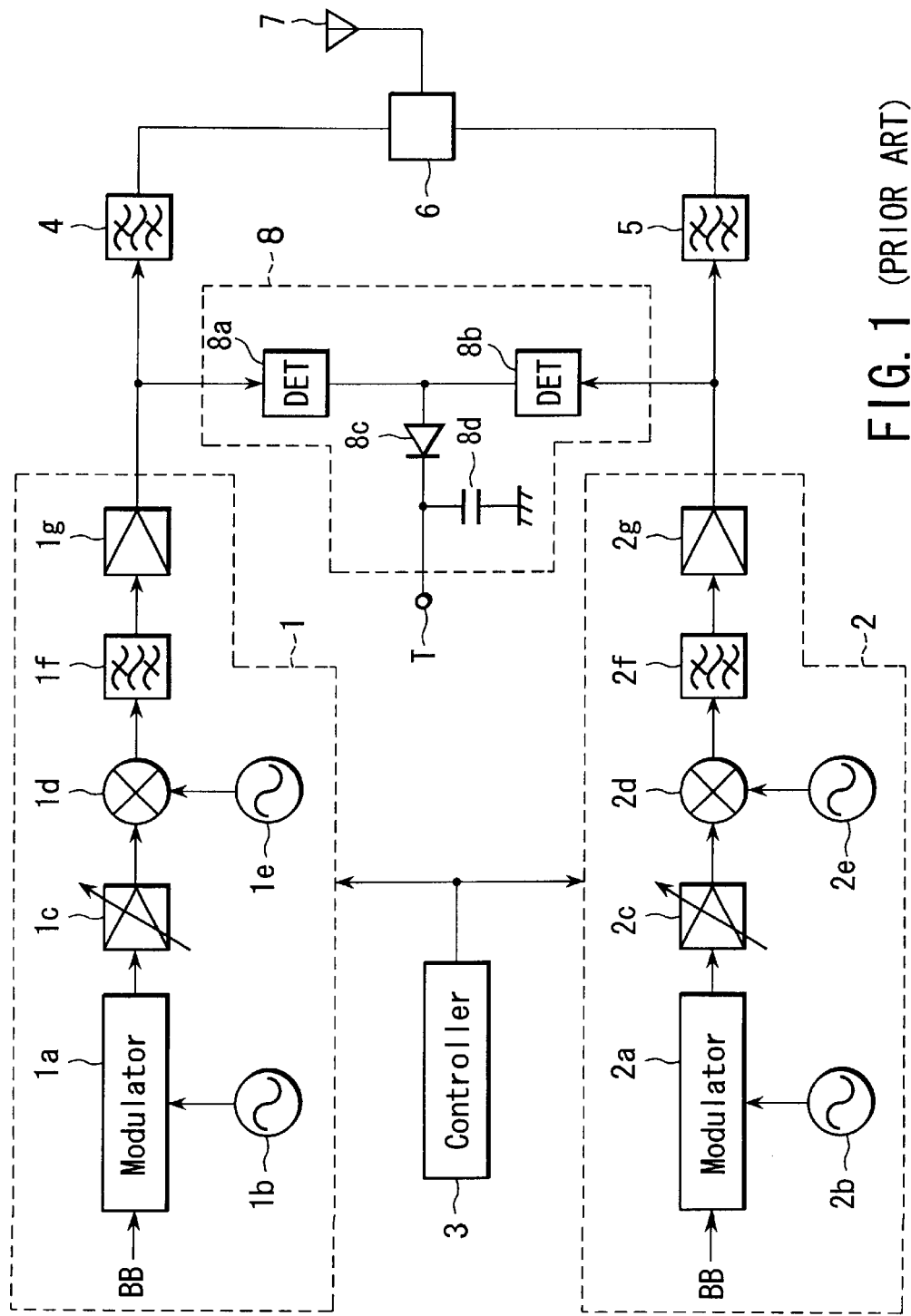
FIG. 1 is a view showing an arrangement of a radio transmission section of a conventional radio telephone apparatus.
Figure 2:
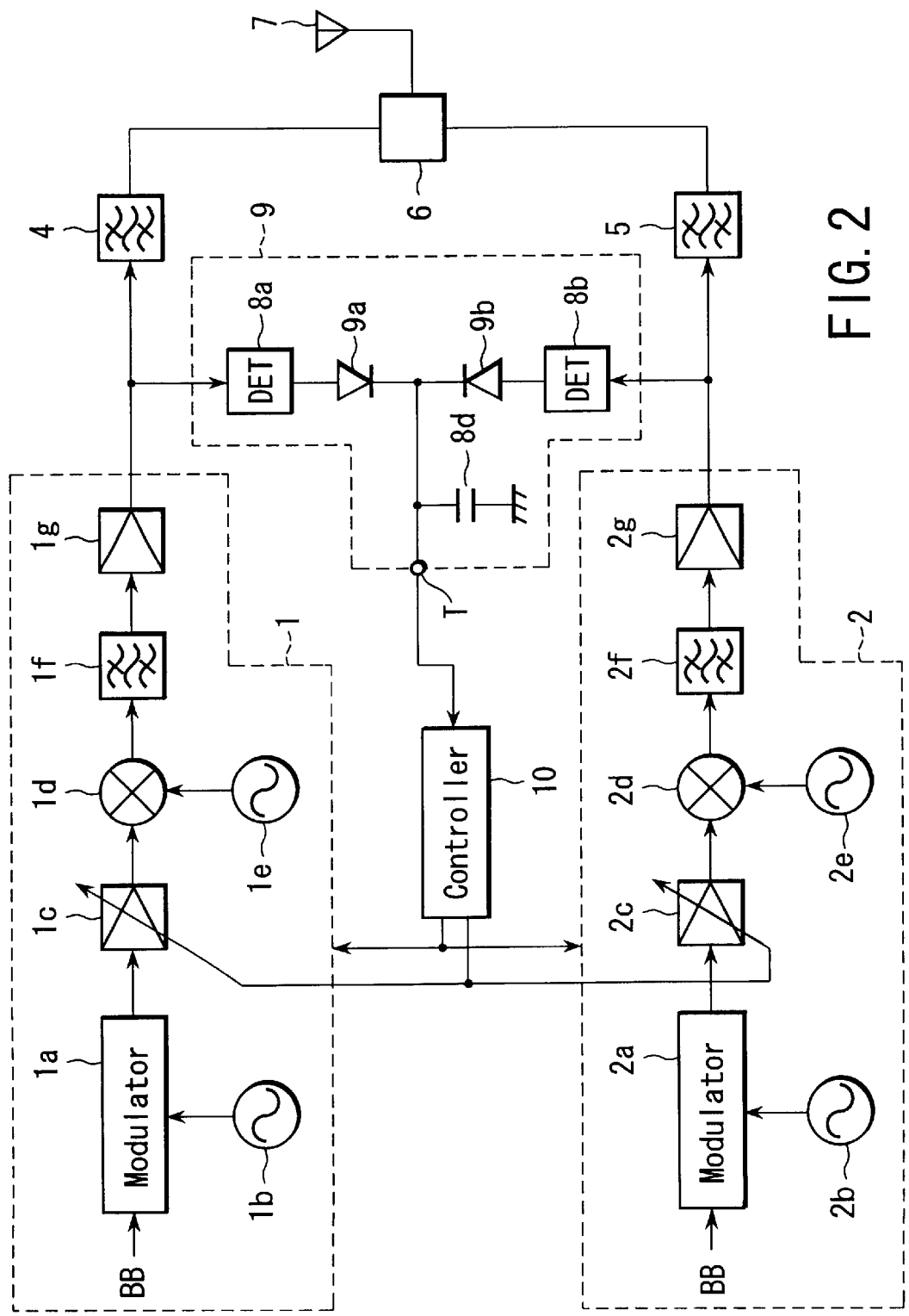
FIG. 2 is a view showing an arrangement of a radio transmitting section of a radio telephone apparatus according to an embodiment of the present invention.

FIG. 2 is a view showing an arrangement of a radio transmitting section of a radio telephone apparatus according to the present embodiment. The same reference numerals are employed in the embodiment to designate parts or elements corresponding to those in FIG. 1.

The radio transmitting section of the radio telephone apparatus shown in FIG. 2 has transmitting units 1 and 2, bandpass filters 4 and 5, diplexer 6, antenna 7, transmission power detecting apparatus 9 and controller 10.

The transmitting unit 1 comprises a modulator 1a, an intermediate frequency band oscillator 1b, an AGC amplifier 1c, an up converter 1d, a local oscillator 1e, a bandpass filter 1f and a power amplifier 1g. The transmitting unit 2 comprises a modulator 2a, an intermediate frequency band oscillator 2b, an AGC amplifier 2c, an up converter 2d, a local oscillator 2e, a bandpass filter 2f, and a power amplifier 2g.

A transmit signal of a baseband applied from a baseband section, not shown, is used as a modulating signal and, with it, intermediate frequency band signals applied from intermediate frequency band oscillators 1b and 2b are modulated by modulators 1a and 1b to provide transmit signals of an intermediate frequency band. The transmit signals outputted from the modulators 1a and 1b are amplified by the AGC amplifiers 1C and 2C, respectively. The transmit signals thus amplified are mixed, by the up converters 1d and 2d, with local signals of frequencies f1 and f2, respectively, supplied from the local oscillators 1e and 2e. By doing so, these signals are up-converted to radio frequency bands having the frequencies f1 and f2 as center frequencies, respectively. The transmit signals outputted from the up-converters 1d and 2d have their undesired frequency components eliminated by the bandpass filters 1f and 2f, respectively. The transmit signals coming from the bandpass filters 1f and 2f are amplified, by the power amplifiers 1g and 2g, up to power levels necessary to their radio transmission. The outputs of the power amplifiers 1g and 2g are used respectively as the outputs of the transmitting units 1 and 2, respectively.

The bandpass filters 4 and 5 eliminate undesired power contained in the transmit signals outputted from the transmitting units 1 and 2, respectively.

The diplexer 6 supplies the transmit signals outputted from the bandpass filters 4 and 5, respectively, to the antenna 7. The antenna 7 radiates the transmit signal supplied from the diplexer 6.

The transmission power detecting apparatus 9 comprises power detectors (DET) 8a and 8b, smoothing capacitor 8d and diodes 9a and 9b.

The transmit signals outputted from the transmitting units 1 and 2 are inputted to the power detectors 8a and 8b, respectively. The power detectors 8a and 8b detect the power levels of the inputted transmit signals and output detection signals of those levels corresponding to these power levels, respectively. Thus the detection signals become an AC signal of a varying level corresponding to a variation in power level of output signals from the transmitting units 1 and 2.

The detection signal outputted from the power detector 8a is supplied to the anode of the diode 9a. The detection signal outputted from the power detector 8b is supplied to the anode of the diode 9b. The cathodes of the diodes 9a and 9b are commonly connected to an output terminal T.

The smoothing capacitor 8d is connected at one end to the cathodes of the diodes 9a and 9b and at the other end to ground.

Figure 3:
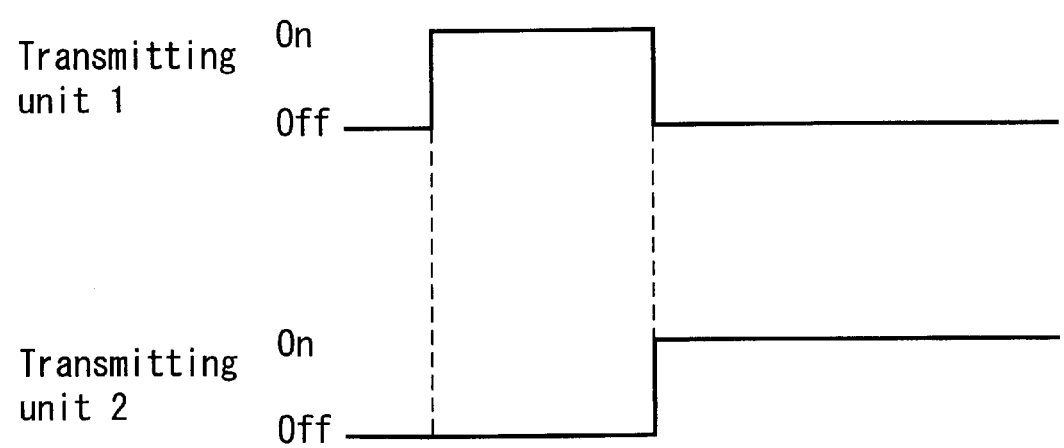
FIG. 3 is a timing chart showing the timing of transmit operations of two transmitting units shown in FIG. 2.

The controller 10 controls the operations of the transmitting units 1 and 2. The controller 10 controls the transmit operation of the transmitting units 1 and 2 in an ON/OFF fashion so as to prevent both the transmitting units 1 and 2 from simultaneously outputting the transmit signals as shown, for example in FIG. 3. Further, the controller 10 controls the gains of the AGC amplifiers 1c and 2c so as to adjust the transmit output from the transmitting units 1 and 2 to a predetermined level on the basis of an output from the output terminal T.

The operation of the radio telephone apparatus thus configured will be explained below. The operation involving the transmission of the transmit signals is the same as that of the existing equivalent apparatus and its operation is, therefore, omitted. Here, an explanation will be made below about the operation associated with the transmission power detection by the transmission power detecting apparatus 9.

Under the control of the controller 10, the transmitting units 1 and 2 perform the transmit operations in mutually different timings.

Assume that the transmitting unit 1 performs a transmit operation. Then a transmit signal is outputted from the transmitting unit 1 and it is supplied through the bandpass filter 4 and diplexer 6 to the antenna 7 where it is radiated. The transmit signal outputted from the transmitting unit 1 is inputted to the power detector 8a in the transmission power detecting apparatus 9. At this time, the transmitting unit 2 performs no transmit operation and there is no inputting of a transmit signal to the power detector 8b in the transmission power detecting apparatus 9.

In this state, the detection signal outputted from the power detector 8a is rectified by the diode 9a and smoothed by the smoothing capacitor 8d. As a result, the level of the detection signal outputted from the power detector 8a appears on the output terminal T. That is, a DC voltage of a level corresponding to the power level of the transmit signal outputted from the transmitting unit 1 emerges on the output terminal T. As this time, a signal passed through the diode 9a is blocked by the diode 9b and it is not flowed into the power detector 8b. That is, the transmit signal outputted from the transmitting unit 1 is blocked by the diode 9b from being flowed into a transmitting system on the transmitting unit 2 side.

If, on the other hand, the transmitting unit 2 performs a transmit operation. Then a transmit signal is outputted from the transmitting unit 2 and it is supplied through the bandpass filter 5 and diplexer 6 to the antenna 7 where it is radiated. The transmit signal outputted from the transmitting unit 2 is inputted to the power detector 8b in the transmission power detecting apparatus 9. At this time, the transmitting unit 1 performs no transmit operation and there is no inputting of the transmit signal to the power detector 8a in the transmission power detecting apparatus 9.

In this state, the detection signal outputted from the power detector 8b is rectified by the diode 9b and smoothed by the soothing capacitor 8d. As a result, the level of the detection signal outputted from the power detector 8b appears on the output terminal T. That is, a DC voltage of a level corresponding to the power level of the transmit signal outputted from the transmitting unit 2 emerges on the output terminal T. At this time, a signal passing through the diode 9b is blocked by the diode 9a and it is not flowed into the power detector 8a. That is, the transmit signal outputted from the transmitting unit 2 is blocked by the diode 9a from being flowed into a transmitting system on the transmitting unit 1 side.

According to the present embodiment, therefore, a transmit signal on one transmitting system is not flowed into the other transmitting system through the transmission power detecting apparatus 9, thus positively preventing a waste loss from being produced. Further, the high harmonic wave of a transmit signal on one transmitting system is prevented from being flowed into the other transmitting system. By doing so, an undesired wave, such as a high harmonic wave, is positively prevented from being released.

In the present embodiment, a single diode is operated both for rectification and for blocking, so that it is possible to realize a very simple structure.

The present invention is not restricted to the above-mentioned embodiment. Even if three or more transmitting units are employed, it is possible to readily apply the present invention to that structure by providing a diode corresponding to an individual transmitting unit. It is not necessary to employ mutually different transmission frequencies for respective transmitting units and the present embodiment may also include a plurality of transmitting units having the same transmission frequency.

The transmission power detecting apparatus of the present invention can also be applied to any other kind of radio transmission apparatus or wired transmission apparatus, etc.

As a rectifier, use may also be made of other kinds of elements or circuits so long as they perform an electrical function similar to the diodes 9a and 9b.

As a smoothing means, use may also be made of other kinds of elements and circuits so long as they perform an electrical function similar to the smoothing capacitor 8d.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transmission power detecting apparatus used for a transmission apparatus having a plurality of transmitting units with each transmitting unit performing no simultaneous transmit operation relative to a remaining transmitting unit and adapted to detect a transmission power at the output of the transmission unit, comprising:

a plurality of detectors each configured to output a detection signal corresponding to an output power of a corresponding one of the transmitting units;

a plurality of rectifiers each configured to receive an output of the corresponding detector at an input terminal and to allow a flow of only electric current from the input terminal toward an output terminal; and a smoothing device configured to smooth a signal supplied to one input terminal to which output terminals of the rectifiers are connected.

2. A transmission power detecting apparatus according to claim 1, in which the rectifier is a diode.

3. A transmission power detecting apparatus according to claim 1, in which the smoothing device is a capacitor.

4. A transmission apparatus comprising:

a plurality of transmitting units each configured to perform no simultaneous transmit operation relative to a remaining transmitting unit;

a plurality of detectors each configured to output a detection signal corresponding to an output power of a corresponding one of the transmitting units;

a plurality of rectifiers each configured to receive an output of the corresponding detector at an input terminal and to allow a flow of only electric current form said input terminal toward an output terminal;

a smoothing device configured to smooth a signal supplied one input terminal to which output terminals of the detectors are connected; and a controller configured to control transmission power of the transmitting unit, which is performing the transmit operation, on the basis of a signal smoothed by the smoothing device.

5. A transmission apparatus according to claim 4, in which the transmitting units transmit signals of mutually different frequency bands.

6. A transmission apparatus according to claim 5, in which said plurality of transmitting units transmit signals by the same transmitting mode.

* * * * *